(12) United States Patent
Kumagai

(10) Patent No.: US 6,555,742 B2
(45) Date of Patent: *Apr. 29, 2003

(54) EARTH GROUND TERMINAL

(75) Inventor: Izuru Kumagai, Miyagi-ken (JP)

(73) Assignee: Tyco Electronics Logistics AG (CH)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/471,446

(22) Filed: Dec. 23, 1999

(65) Prior Publication Data

US 2002/0062969 A1 May 30, 2002

(30) Foreign Application Priority Data

Dec. 25, 1998 (JP) .......................... 10/369267

(51) Int. Cl.[7] ................................. H01R 4/00
(52) U.S. Cl. ................. 174/6; 174/7; 439/513
(58) Field of Search .................... 174/6, 75 F, 262, 174/265; 194/315; 200/61.78, 535; 439/513

(56) References Cited

U.S. PATENT DOCUMENTS

| 4,674,811 A | * | 6/1987 | Corwin | 439/69 |
| 4,823,235 A | | 4/1989 | Suzuki et al. | 361/424 |
| 5,159,826 A | * | 11/1992 | Miyazawa et al. | 72/358 |
| 5,259,769 A | | 11/1993 | Cruise et al. | 439/65 |
| 5,470,255 A | | 11/1995 | McCleerey et al. | 439/500 |
| 5,518,424 A | | 5/1996 | Douty et al. | 439/660 |
| 5,709,574 A | * | 1/1998 | Bianca et al. | 439/858 |

FOREIGN PATENT DOCUMENTS

| EP | 0 142 922 | 5/1985 |
| EP | 0 653 817 A1 | 5/1995 |
| JP | H05-46094 | 6/1993 |
| JP | 5-136578 | 6/1993 |
| JP | H06-20730 | 1/1994 |
| JP | WO96/31919 | 10/1996 |
| JP | 09115574 | 2/1997 |

* cited by examiner

Primary Examiner—Dean A. Reichard
Assistant Examiner—W. David Walkenhorst
(74) Attorney, Agent, or Firm—Hoffman & Baron, LLP

(57) ABSTRACT

An earth ground terminal provides an electroconductive substrate part and an electroconductive spring contact which protrudes integrally from one edge of the substrate part toward the side opposite to the substrate part. Through holes which have undergone a burring process are formed in the aforementioned substrate part. The earth ground terminal is used to prevent electromagnetic inductive interference, high-frequency inductive interference, etc. The earth ground terminal is effective when a printed substrate is grounded by a shield plate or a chassis.

4 Claims, 2 Drawing Sheets

EARTH GROUND TERMINAL

FIELD OF THE INVENTION

The invention of the present application pertains to an earth ground terminal which is used to prevent electromagnetic inductive interference, high-frequency inductive interference, etc. when a printed substrate is ground by another printed substrate, a shield plate, a chassis, a case (frame), etc.

BACKGROUND OF THE INVENTION

Japanese Kokai Patent Application No. Hei 9[1997]-115574 disclosed a connection terminal as an example of the prior type of earth ground terminal. FIG. 6 shows the state when the connection terminal is soldered to a printed circuit board. For the aforementioned connection terminal, a pair of soldering parts 6 and 7 are set up appropriately at different positions along the same straight line in the longitudinal direction of connection part 4 so that the inner surfaces of the soldering parts face each other. In this way, the solder can expand in such a direction that the surface tension of the solder in soldering parts 6 and 7 cancel each other. Therefore, position deviation can be prevented during soldering.

However, when the aforementioned connection terminal is soldered to the printed circuit board, it is difficult to determine by visual observation whether the solder fillet is reliably attached to the soldering parts. It is especially difficult to make the aforementioned determination for soldering part 7 which is covered by connection part (spring contact) 2. Also, a small terminal makes it more difficult to make the aforementioned determination.

BRIEF SUMMARY OF THE INVENTION

The purpose of the invention of the present invention is to solve the aforementioned problem by providing a small and inexpensive earth ground terminal whose soldering state can be confirmed easily.

In order to realize the aforementioned purpose, the invention of the present application provides an earth ground terminal characterized by the fact that the earth ground terminal comprises an electroconductive substrate part and an electroconductive spring contact which protrudes integrally from one edge of the substrate part toward the side opposite to the substrate part, and through holes that have undergone a burring process are formed in the substrate part.

DETAILED DESCRIPTION OF THE PREFERRED EMBODIMENT

Figure 1:
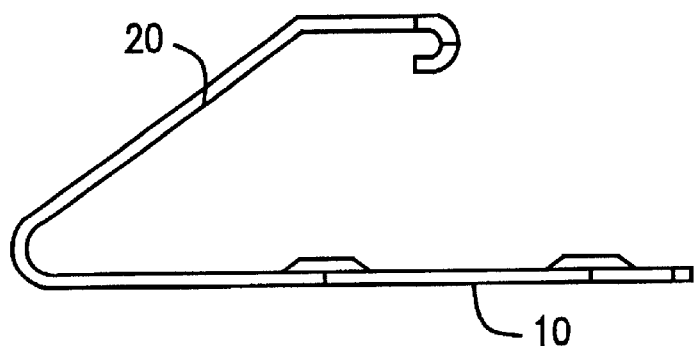
FIG. 1 is a side view illustrating the earth ground terminal of the invention of the present invention.
Figure 2:
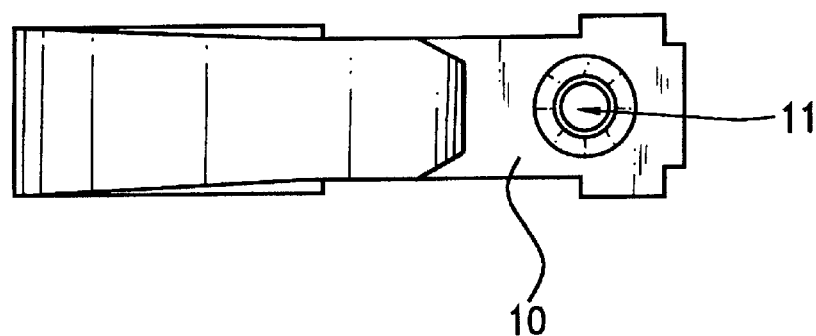
FIG. 2 is a plane view illustrating the earth ground terminal shown in FIG. 1.
Figure 3:
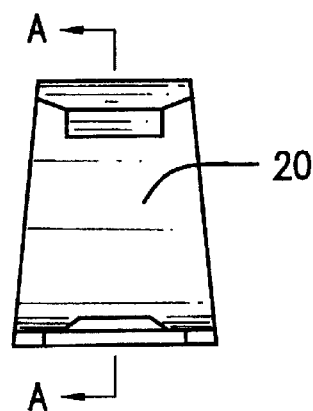
FIG. 3 is a front view illustrating the earth ground terminal shown in FIG. 1.
Figure 4:
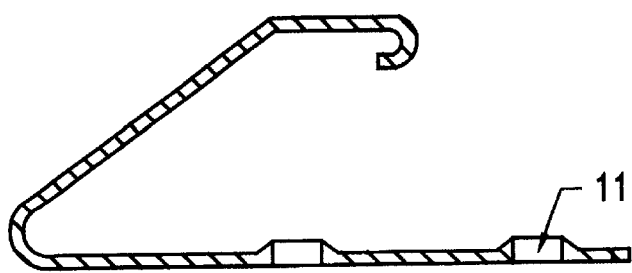
FIG. 4 is a cross-sectional view along line A—A in FIG. 3.
Figure 5:
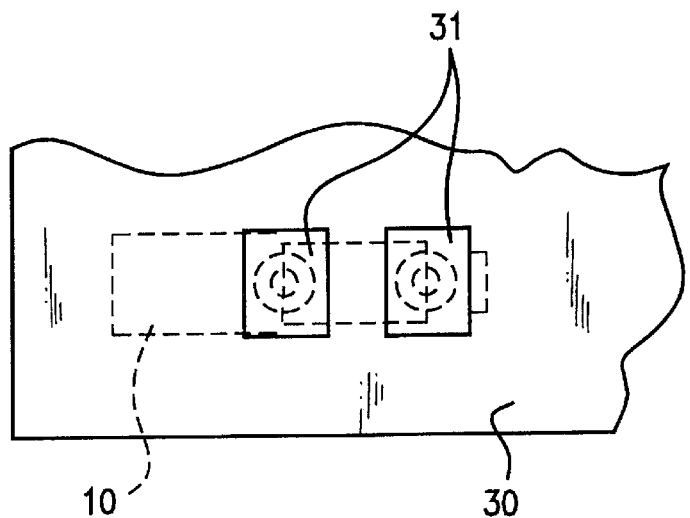
FIG. 5 is a plane view illustrating the pad (grounding trace) used in the invention of the present invention.
Figure 6:
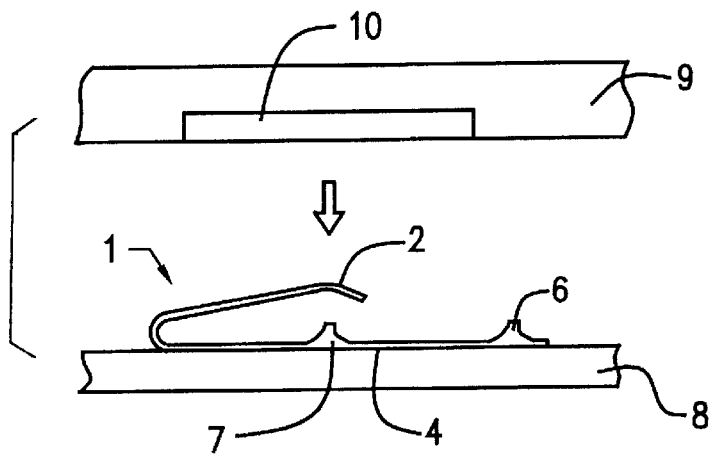
FIG. 6 is a diagram illustrating the use of a conventional prior art terminal.

The earth ground terminal of the present invention includes electroconductive substrate part 10 and spring contact 20. The substrate part is mounted on electroconductive pad (grounding trace) 31 of printed circuit board 30 by means of soldering. The spring contact protrudes integrally from one edge of the substrate part toward the side opposite to the substrate part.

Through holes 11 which have undergone a burring process are formed in the substrate part at least two locations along the longitudinal direction of the substrate part. Because a burring process is performed on the inner peripheral portion of each through hole, that portion protrudes in a cylindrical shape from the inside of the substrate part to the outside of the substrate part. Also, the inner surface of the substrate part is plated for good solderability.

Electroconductive pads 31 formed on the printed circuit board are either arranged in a pattern with a dimension equal to or small than that of the substrate part of the earth ground terminal or arranged independently on the printed circuit board corresponding, respectively, to the plural through holes formed on the substrate part of the terminal.

In the present example shown in the figures, a curled part 21 bent to the inside is arranged at the tip of the spring contact.

The use of the earth ground terminal of the present invention will be explained.

The substrate part of the earth ground terminal is fixed on grounding trace 31 of printed circuit board 30 by means of soldering. More specifically, plural earth ground terminals of the present invention are placed on a tape. The spring contact part of each earth ground terminal is vacuum grabbed by an automatic machine. After the earth ground terminal is transported to a prescribed location of the printed circuit board, the suction is released. As a result, the terminal is dropped onto the inner surface of the substrate part and is carried on the printed circuit board. Subsequently, the printed circuit board is passed through a soldering row, and the terminal is soldered to the circuit board in the same way as other circuit elements on the printed circuit board.

Then, in order to ground the pad (grounding trace) 31 of the printed circuit board, the earth ground terminal is brought in contact with a shield panel (or a chassis, frame, etc.). For example, if a case with a shield panel installed in it is sued, when the printed circuit board is accommodated in a case through the earth ground terminal of the present invention, the spring contact of the earth ground terminal is pushed back and makes contact with the shield panel.

The terminal of the present invention has the following characteristics.

For the earth ground terminal of the present invention, since a burring process is performed for the through holes formed in the substrate part, when the substrate part is soldered to the pad (grounding trace) of a printed circuit board, the solder is attached to the inner surface of each through hole which protrudes in a cylindrical shape. Therefore, the solder can be attached/connected reliably in the through holes.

Also, for the earth ground terminal of the present invention, since the solder fillet can be observed through the through holes, soldering defects can be detected easily. This is a significant effect is cases where the pad of the printed circuit board is small.

Since soldering defects can be detected even if the pad is small, there is a tolerance in the precision of the position where the terminal is installed. Consequently, the size of the terminal can be reduced, and the device can be miniaturized correspondingly.

In the earth ground terminal of the present invention, the through holes are formed at two locations along the longitudinal direction of the substrate part, and the electroconductive pads can be arranged independently on the printed circuit board to correspond to the through holes, respectively. In this case, during reflow of the solder, the surface tension occurring on the solder fillets of the burring-processed portion (cylindrical protrusions of the inner peripheral surface) of the through holes cancel each other. Consequently, position deviation of the terminal can be prevented.

Since the earth ground terminal of the present invention has the aforementioned advantages, it can.be used to deal with noise, EMI, or other problems of portable communication equipment, CRT or TFT, displays using STN color liquid crystal, and other electronic devices.

What is claimed is:

1. An earth ground terminal comprising an electroconductive substrate part and an electroconductive spring contact which protrudes integrally from one edge of the substrate part toward the side opposite to the substrate part, and through holes that have undergone a burring process are formed on the substrate part, said through holes being defined by a protruding cylindrical shape forming an inner solder attachment surface.

2. An earth ground terminal of claim 1 wherein said through holes are formed at two or more locations along the longitudinal direction of the aforementioned substrate part.

3. An earth ground terminal assembly including the earth ground terminal of claim 2 and electroconductive pads formed on a printed circuit board where the earth ground terminal is mounted, and the pads are formed independently on the printed-circuit board to correspond, respectively, to plural through holes formed on the substrate part of the earth ground terminal.

4. An earth ground terminal assembly of claim 1 wherein said solder attachment is viewable through said through holes.

* * * * *